United States Patent
Balraj et al.

(10) Patent No.: US 8,045,666 B2
(45) Date of Patent: Oct. 25, 2011

(54) SPREAD SPECTRUM CLOCK GENERATOR

(75) Inventors: Vishnu Balraj, Folsom, CA (US); Terry Baucom, El Dorado Hills, CA (US); Amir Bashir, El Dorado Hills, CA (US); Huimin Chen, Portland, OR (US); Ken Drottar, Portland, OR (US); Naveed Khan, Folsom, CA (US); Duane Quiet, Hillsboro, OR (US); Andrew M. Volk, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 729 days.

(21) Appl. No.: 11/726,911

(22) Filed: Mar. 22, 2007

(65) Prior Publication Data

US 2008/0231331 A1 Sep. 25, 2008

(51) Int. Cl.
*H04L 7/00* (2006.01)
(52) U.S. Cl. ...................................... 375/371
(58) Field of Classification Search ................. 375/371, 375/373
See application file for complete search history.

(56) References Cited

U.S. PATENT DOCUMENTS

| | | | |
|---|---|---|---|
| 6,943,606 B2 | 9/2005 | Dunning et al. | |
| 2004/0212412 A1* | 10/2004 | Saeki | 327/156 |
| 2007/0001882 A1* | 1/2007 | Zhang et al. | 341/143 |
| 2007/0041486 A1* | 2/2007 | Shin | 375/376 |

OTHER PUBLICATIONS

Aoyama et al., "3Gbps, 5000ppm Spread Spectrum SerDes PHY with frequency tracking Phase Interpolator for Serial ATA", Symposium on VLSI Circuits Digest of Technical Papers, 2003, pp. 107-110.
Sugawara et al., "1.5 Gbps, 5150 ppm Spread Spectrum SerDes PHY with a 0.3 mW, 1.5 Gbps Level Detector for Serial ATA", Symposium on VLSI Circuits Digest of Technical Papers, 2002, pp. 60-63.
Kim et al., "Spread Spectrum Clock Generator With Delay Cell Array to Reduce Electromagnetic Interference", IEEE Transactions On Electromagnetic Compatibility, vol. 47, Issue No. 4, Nov. 2005, pp. 908-920.

* cited by examiner

*Primary Examiner* — Kevin Kim
(74) *Attorney, Agent, or Firm* — Erik R. Nordstrom

(57) ABSTRACT

Disclosed are embodiments of methods and circuits to generate spread spectrum clocks.

12 Claims, 5 Drawing Sheets

SPREAD SPECTRUM CLOCK GENERATOR

BACKGROUND

Spread spectrum clocks are used in integrated circuits, for example in system on chips, processors, and chipset chips, to reduce the adverse effects of electro-magnetic interference (EMI). They are clocks with changing frequencies, usually vacillating between a max. and min. value in accordance with a desired modulation profile function (e.g., sine wave, triangle wave, etc.). Conventional circuits commonly generate SSC clocks inside a PLL, either by modulating a VCO control voltage or by modulating a feedback divider ratio. Unfortunately, modulating the VCO control voltage can be difficult, especially when the VCO gain is high and noise within the bandwidth of the PLL loop filter is typically directly coupled to the VCO. Modulating the feedback divider ratio can be done digitally but filtering out the spurious tone created by this requires a good low-pass filter and other techniques such as noise shaping. Accordingly, new approaches are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
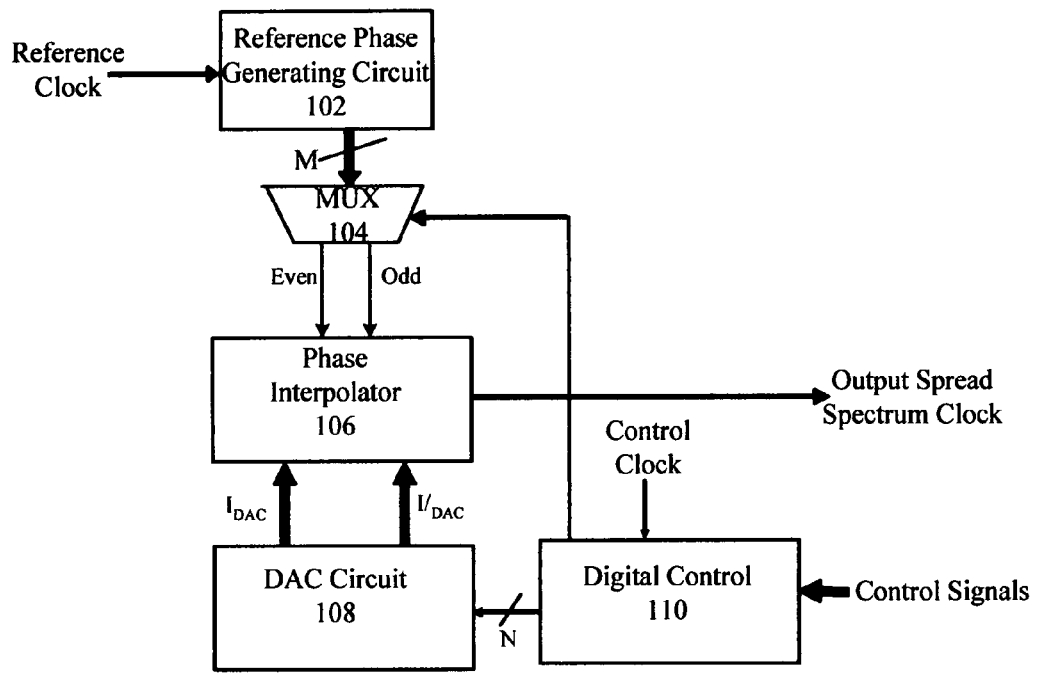
FIG. 1 is a diagram of a spread spectrum clock generator in accordance with some embodiments.

FIG. 1 shows a spread spectrum clock (SSC) generation circuit in accordance with some embodiments. It generally comprises a reference phase clock generation circuit 102, analog phase interpolator (or mixer) circuit 106, multiplexer 104, digital-to-analog converter (DAC) 108, and digital control logic 110, coupled together as shown. (Note that with this drawing, as well as others in this disclosure, signals are represented with lines. Some may be thicker, to indicate more constituent signal paths, have a number label, to indicate a number of constituent signal paths, and/or have arrows at one or more ends, to indicate primary information flow direction. This is not intended to be limiting. Rather, it is used in connection with one or more exemplary embodiments to facilitate easier understanding of a circuit. Any represented signal, as dictated by design needs or preferences, may actually comprise one or more signals that may travel in either direction and may be implemented with any suitable type of signal scheme, e.g., differential pair, single-ended, etc.)

The reference phase clock generation circuit 102 may be implemented with any suitable circuitry such as a delay locked loop (DLL) or phase locked loop (PLL). It receives a reference clock (Reference Clock) and produces from it a number M (e.g., 4, 5, 8, 12) of reference phase clocks (or reference phases), typically distributed evenly about a phase plane. For example, with the embodiment of FIGS. 2 to 5, it generates eight different reference phases.

Figure 2:
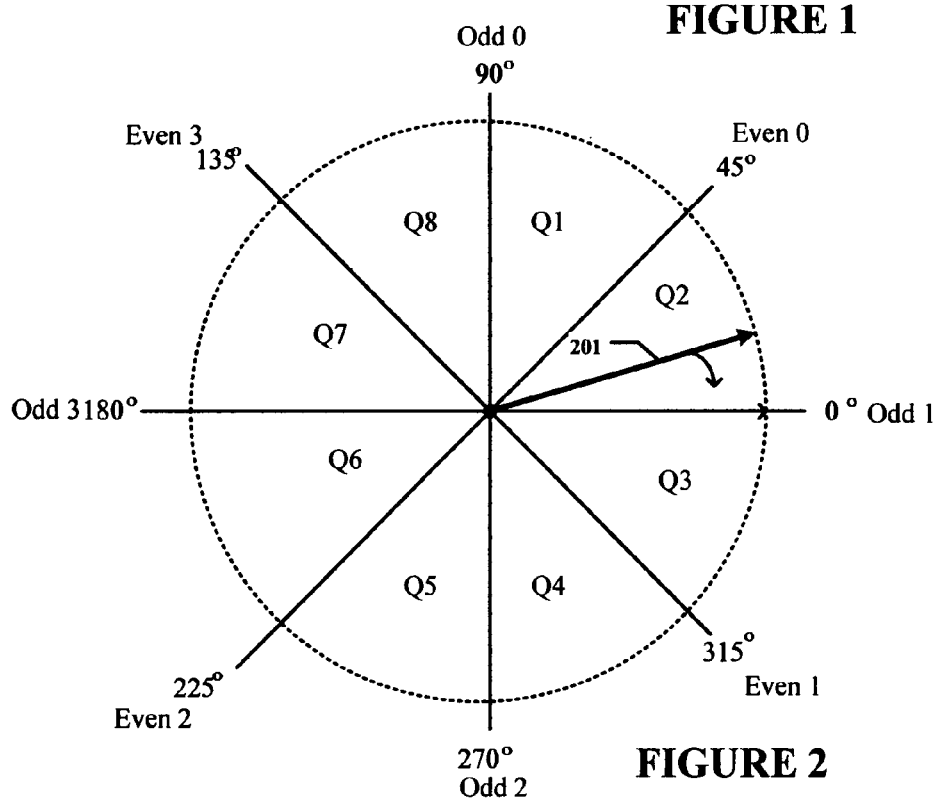
FIG. 2 is a phase plane diagram illustrating rotating phase for a clock signal generated from a phase interpolator.

They may or may not have the same frequency as the reference clock. For example, if the reference phase generator is implemented with a DLL, they would typically have the same frequency as the reference clock. On the other hand, if the phase generator is implemented with a PLL, which, for example, could incorporate frequency division in its feedback loop, the reference phases could have frequencies different from the reference clock. The generated reference phases are distributed evenly about a phase plane such as is illustrated in FIG. 2. The M (e.g., 8) reference phases are coupled to multiplexer 104. For the example with 8 reference phases, multiplexer 104 may act like two 4:1 multiplexers to select two adjacent reference phases based on control signals from the digital control logic 110.

With additional reference to FIG. 2, which groups its eight reference phases into four even reference phases (Even 0 to Even 3) and four odd phase references (Odd 0 to Odd 3), the odd signals are essentially coupled to one of the 4:1 multiplexers, while the even reference phases are coupled to the other 4:1 multiplexer so that a selected odd and a selected even reference phase (adjacent to the selected odd reference phase) are provided to the phase Interpolator 106.

Figure 7:
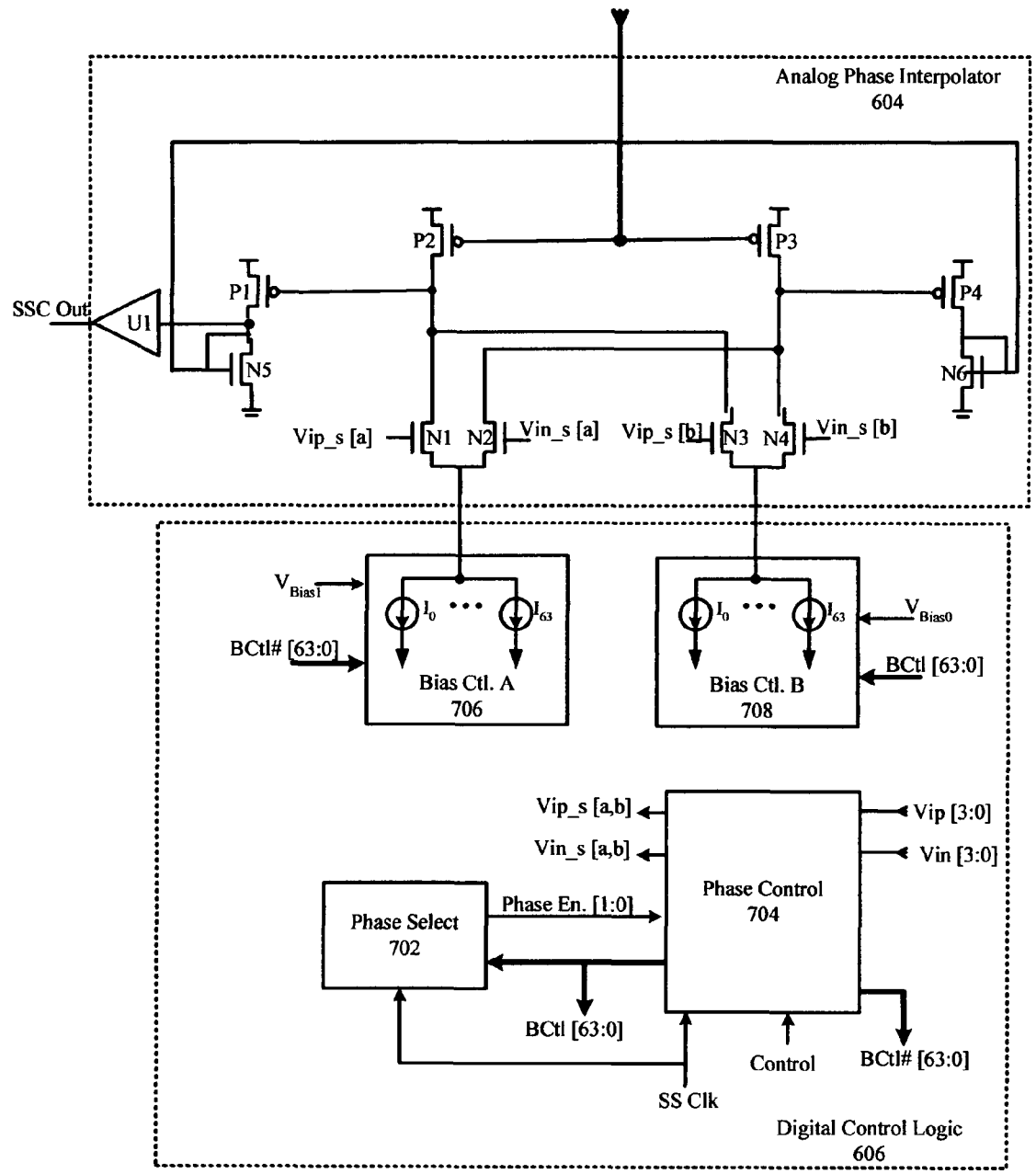
FIG. 7 is a diagram of an analog phase interpolator and control logic for the SSC generator of FIG. 6.

The phase interpolator (or mixer) circuit 106 produces a clock with a phase that is a weighted sum (e.g., weighted average) of the selected odd and even reference phase clocks. It thereby falls between them, as is shown in FIG. 2 where the phase of signal 201 is a weighted phase average of the Even 0 and Odd 1 reference phases. The amount of weighting for each signal is determined by the values of complementary current signals (I, I/) from the DAC circuit 108. Any suitable phase mixer or interpolator may be used, so long as it can generate clocks with controllable phases based on controlled weighting of selected reference phases about a phase plane. An example of a suitable phase interpolator circuit is shown in FIG. 7.

In the depicted embodiment, the DAC circuit 108 generates complementary, analog current outputs ($I_{DAC}$, $I/_{DAC}$) to drive the phase mixer based on an applied digital value. (Note that complementary current signals are used in this embodiment but are not required. Depending on the configuration of the DAC and Phase interpolator, any suitable signal or signals such as voltage signals could be used. For example, in some embodiments, the phase interpolator may include a digital interface thereby alleviating the need for a separate DAC.)

For the exemplary embodiment of FIGS. 2 to 5, a 6-bit DAC with binary weighting (i.e., N in FIG. 1 equal to 6) is used, and thus, the output $I_{DAC}$, $I/_{DAC}$ signals have 64 units of resolution. The minimum achievable phase-step distance is determined by the DAC resolution. An area efficient design would typically seek to minimize the number of bits required to implement the DAC. On the other hand, a relatively small minimum step size may be desired. With this example, where the frequency out of the reference phase generating circuit 102 is 96 MHz, and with eight divisions of the phase plane and a 6-bit DAC, the minimum step size is 20 pS. As a comparison, a 13-bit DAC, in this same example, would result in a minimum step of about 0.2 pS.

With the DAC's current outputs being complementary, $I_{DAC}$ has an analog value corresponding to the applied digital value, and $I/_{DAC}$ has an analog value corresponding to the complement of the applied digital signal. For example, if '110111 is applied to the DAC, then $I_{DAC}$ would have a value corresponding to '110111 and $I/D_{AC}$ would have a value corresponding to '001000. This allows for a convenient implementation of a so-called Gilbert cell where the currents are steered to combine the selected odd and even phase signals with the resultant phase signal having a constant magnitude throughout the phase plane.

The digital control logic 110 controls the multiplexer 104 and DAC 108 to select the different, adjacent phase signal pairs to generate and rotate a resultant SSC phase signal about the phase plane. It does this in order to achieve a spread spectrum clock with desired characteristics. It is clocked by a control clock (Control Clock), which may be tapped from the reference phase generation circuit 102, or alternatively, as with the embodiment of FIG. 6 below, it could be tapped from the generated spread spectrum clock itself.

Accumulating phase delay, the SSC phase signal is rotated in a clockwise direction, at increasing rates of rotation, to increase the clock period of the SSC. When it reaches the halfway point of the modulation cycle, it then rotates the phase signal in a counter-clockwise direction to decrease phase delay, thereby decreasing the modulation clock period until the nominal period is reached. This is repeated in accordance with the frequency of a modulation clock, and a spread spectrum clock such as that shown in FIG. 3 (discussed below) is generated.

Figure 3:
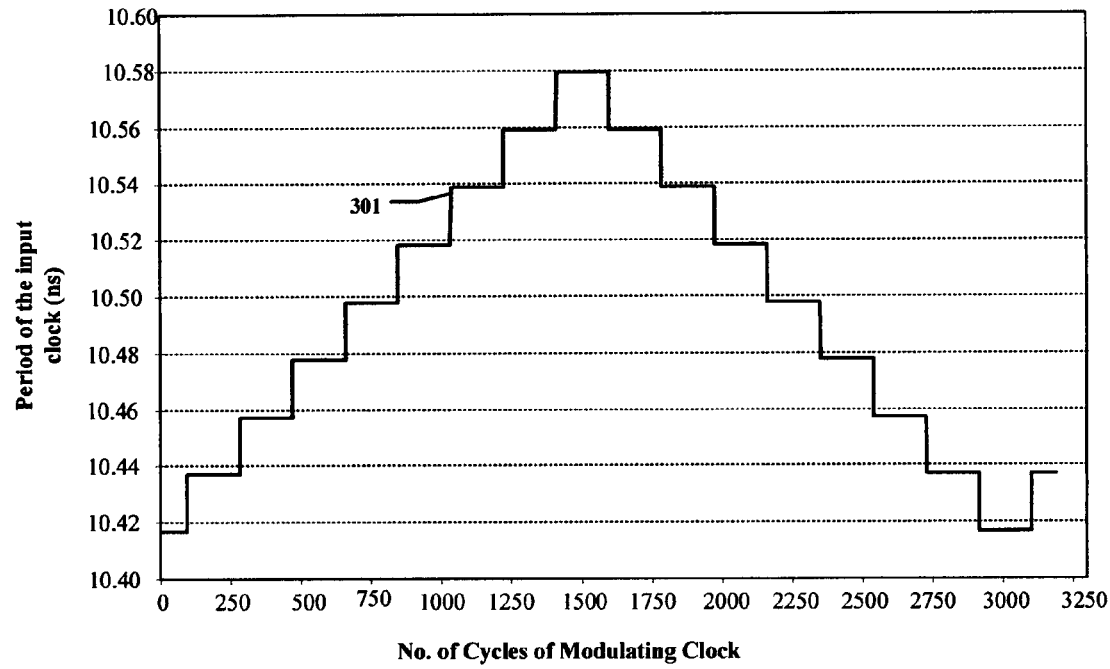
FIG. 3 is a signal diagram showing changing clock period over time for an exemplary spread spectrum clock in accordance with some embodiments.

FIG. 3 is a graph depicting an exemplary SSC clock 301 generated from the SSC generator of FIG. 1. The graph shows its periods as a function of time (measured in cycles of the reference clock). Since a clock's period is inversely proportional to its frequency, this graph indirectly shows how the spread spectrum (SS) clock's frequency varies over time. In the depicted embodiment, the reference phase clock frequencies are at a constant frequency of 96 MHz, which corresponds to the nominal frequency of the generated SSC. Thus, the nominal SSC period is 10.4167 nS. As the phase signal is rotated in a clockwise direction, this period is stretched (up to about 10.58 nS in this example) and then returned back to the nominal period. This is done using a modulating clock (essentially generated within the digital control logic from the control clock) to rotate the phase signal about the phase plane via DAC 108. In this example, the modulating clock frequency is approximately 32 KHz. Thus, 3096 MHz clock periods are impacted per modulating clock period.

As seen in the graph, during the first half of the modulation cycle, the SSC clock period is progressively increased in a step-wise manner. At the mid point, 1500 SSC nominal clock periods, the period begins ramping back down to the nominal period. The cycle then repeats. Therefore, with this example, the generated SSC fluctuates, in accordance with a stepwise ramp function, from 96 MHz to about 94.5 MHz. with the ramp function having a full-wave period of about 31.25 µS. (Note that while the modulating profile used in this example is a simple ramp (or triangle), other profiles could be implemented by modifying the digital logic.)

Figure 4:
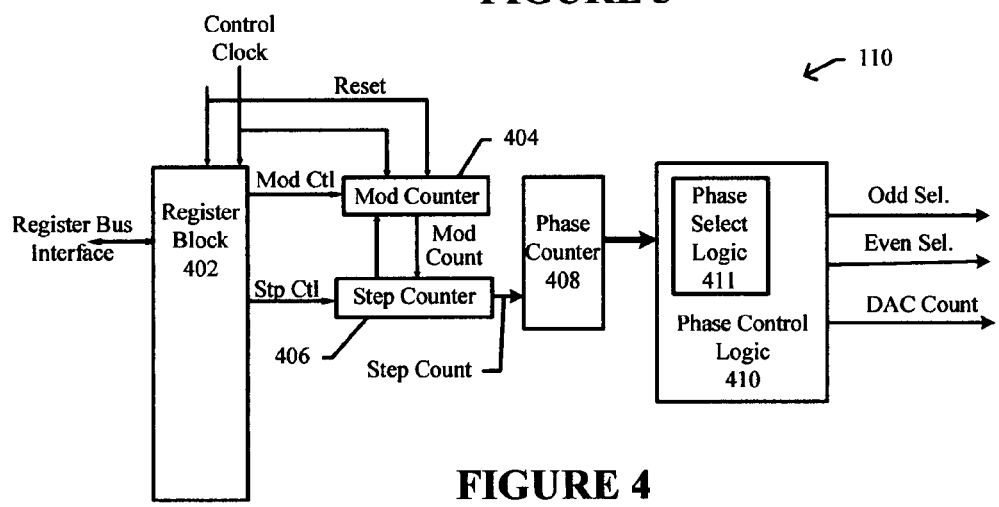
FIG. 4 is a diagram of a digital control logic for generating a spread spectrum clock with the circuit of FIG. 1 in accordance with some embodiments.

FIG. 4 shows a block diagram of digital control logic 110 for generating an SSC in accordance with some embodiments. It comprises a register block 402, Mod Counter 404, Step Counter 406, Phase counter 408, and Phase Control Logic 410, coupled together as shown. The control logic 110 receives the control clock and a reset signal (Reset) and generates odd and even phase select signals (Odd Sel., Even Sel.), along with a DAC count signal (DAC Count). The control logic 110 is also coupled to a register interface through register block 402 to receive programmable settings for controlling the parameters of the generated SSC.

The modulation counter 404 generates a "Mod Count." Its count rate is controlled by the control clock. It is an up counter that counts from 0 to a programmed maximum value and then restarts from zero and starts up counting again. The Mod Count determines the length of time that the phase interpolator stays at any given modulation level. It should be selected based on the desired percentage of spreading and frequency of modulation. In the depicted embodiment, it controls the step counter 406 to increment its "Step Count" when the Mod Count reaches its maximum value. The time it takes for the Mod Count to go from 0 to its max. value corresponds to the time the SSC is at a given clock-period step.

The Step Count determines the size of the count steps for the DAC Count, which determines the percent of modulation. It increments when the Mod Count reaches its maximum value. It comprises an up/down counter that starts at zero, counts up and when reaching a maximum value, counts down until it reaches zero.

The DAC Count signal (which in this embodiment is a 6-bit signal since the DAC is a 6-bit DAC) counts from 0 to 63. This corresponds to the $I_{DAC}$ current starting at its min. value and progressing upward to its max. value, and the $I/_{DAC}$ starting at its max. value and progressing downward to its min. value. After it reaches 63, it changes direction and down-counts until it reaches zero. This is repeated through the operation of the SSC generator. Each time it reaches the end of its up or down count, either the odd or even phase select signal increments (or decrements, depending on phase rotation direction) to select the next odd or even reference phase. For example, with reference back to FIG. 2, assume the phase signal is rotating clockwise and the Even 0 and Odd 1 phase references are currently selected. (Assume that IDAC is controlling the Odd reference phases and I/DAC is controlling the even phase references, implying that the DAC Count is now counting upward.) When the phase signal reaches 0 degrees (DAC Out equals '111111 with all phase contribution coming from Odd 1), then the even phase select signal (Even Sel.) increments to select from Even 0 to Even 1, and the DAC Count starts back counting downward. When it reaches "000000, the odd phase select signal (Odd Sel.) then selects the Odd 2 phase reference. This continues, alternating between odd and even phase selection to rotate the phase signal about the phase plane. Note that this reduces glitch generation in that each time a new phase reference signal is selected for the phase interpolator, the corresponding weighting signal ($I_{DAC}$ or $I/_{DAC}$) is at its min. value (e.g., 0).

In operation, starting at the beginning of a "ramp" cycle, the Mod Count starts from half of its max. value and step count starts from zero. (This corresponds to the beginning, lower-left, part of signal 301 in FIG. 3.) From here, the Mod Count counts up, rolling over back to 0 and counting up again. Each time it reaches its max. value, it causes the Step Count to increment. This repeats until Step Count reaches its maximum value with Mod Count at half of its max. value. At this point, everything essentially reverses with the Step Count now counting down and the phase selection sequence reversing. This continues until Step Count reaches 0 and Mod Count reaches half of its max. value. This corresponds to one whole ramp cycle (3000 control clock cycles) from FIG. 3. This repeats in a cyclical fashion with a period corresponding to that of the modulation clock period. (Note that in this embodiment, there is no actual modulation clock used to drive a circuit block. Rather, it is used conceptually to define operating parameters. Of course, in some embodiments, a modulation clock may actually be used.)

Figure 5:
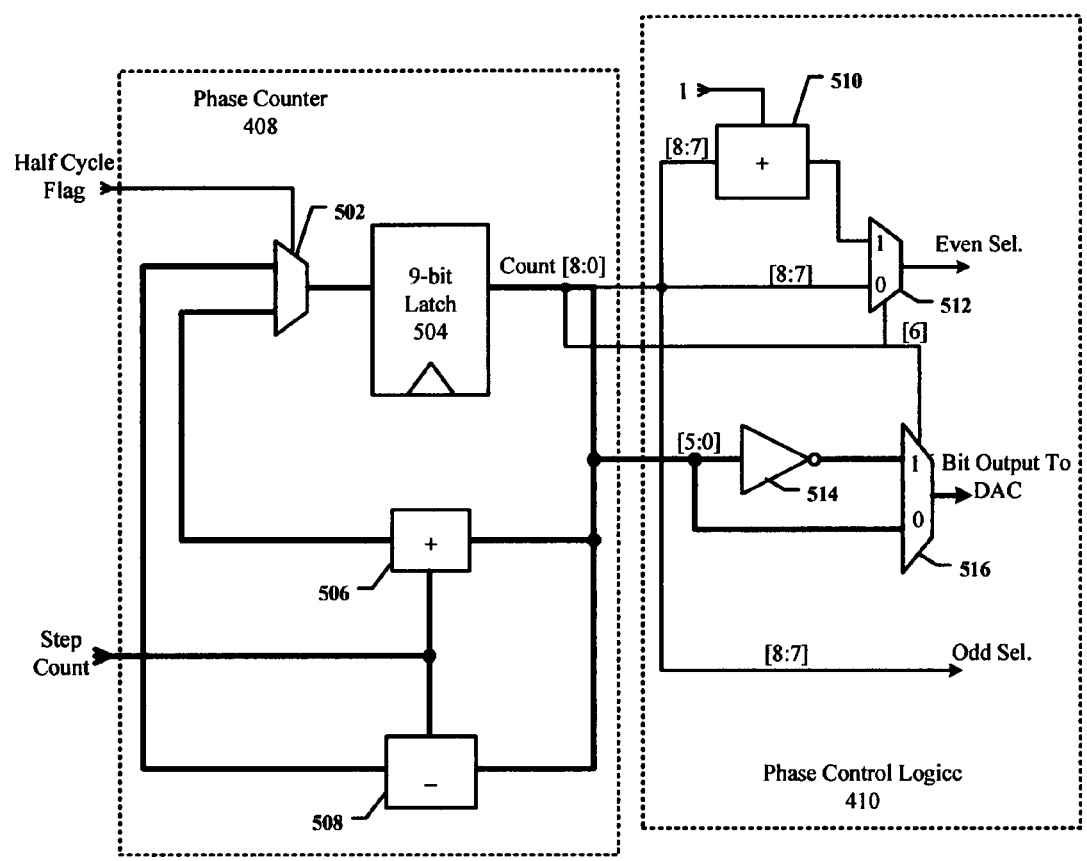
FIG. 5 is a diagram of a circuit for implementing the control logic of FIG. 4.

FIG. 5 shows a phase counter 408 and phase control logic 410, in accordance with some embodiments. It generally comprises a 9-bit 2:1 multiplexer 502, 9-bit latch 504, summing circuits 506-510, 2-bit 2:1 multiplexers 512, 516, and 6-bit inverter 514, all coupled together as shown. (Note that in this figure, the Mod and Step Counters are not shown but may be implemented with any suitable counter and/or logic circuitry to increment or decrement Step Count when the Mod Count rolls over and to set or reset the depicted "Half Cycle Flag" when the Mod Count reaches its half max. value and the Step count is at its max. value. For example, a rollover counter could be used for the Mod Counter 404 and an up/down counter could be used for the Step Counter 406. An AND gate with inputs from the Step Counter output bits and the most significant Mod Counter bit could be used to generate the Half Cycle flag. The Mod Counter 404 and latch 504 could be clocked with the control clock, e.g., from a DLL.)

The indicated Count[8:0] signal corresponds to a 9-bit count coming from latch 504. Summing circuit 506 adds to this count the Step Count value, while summing circuit 508 subtracts the Step Count from it. Depending on whether the SSC is ramping up or down (with reference to the signal shown in FIG. 3), the 2:1 multiplexer 502, as controlled by the Half Cycle flag, selects either the up-counting signal from 506 or down-counting signal from 508 to route back to the latch 504. Thus, the 9-bit Count signal from latch 504 may be counting upward or downward and may be counting by any increment size ranging between the minimum and maximum Step Count values. In some embodiments, the Step Count is programmed to count by one from 0 to 8 and then back down to 0.

The DAC Count signal is provided from multiplexer 516. It either takes the lowest 6 bits from Count[8:0], straight from latch 504, or it takes their inverted form from inverter 514. This multiplexer is controlled by the seventh least significant bit (bit 6) from the Count[8:0] signal.

The even phase select signal (Even Sel.) is provided from multiplexer 512. Based on the state of bit 6 from Count[8:0], it either selects the 2 most significant bits from Count[8:7] directly from Latch 504 or after "1" has been added to them by summing circuit 510. On the other hand, the odd phase select signal (Odd Sel.) is taken directly from the two most significant Count[8:0] bits, bits 8 and 7.

Figure 6:
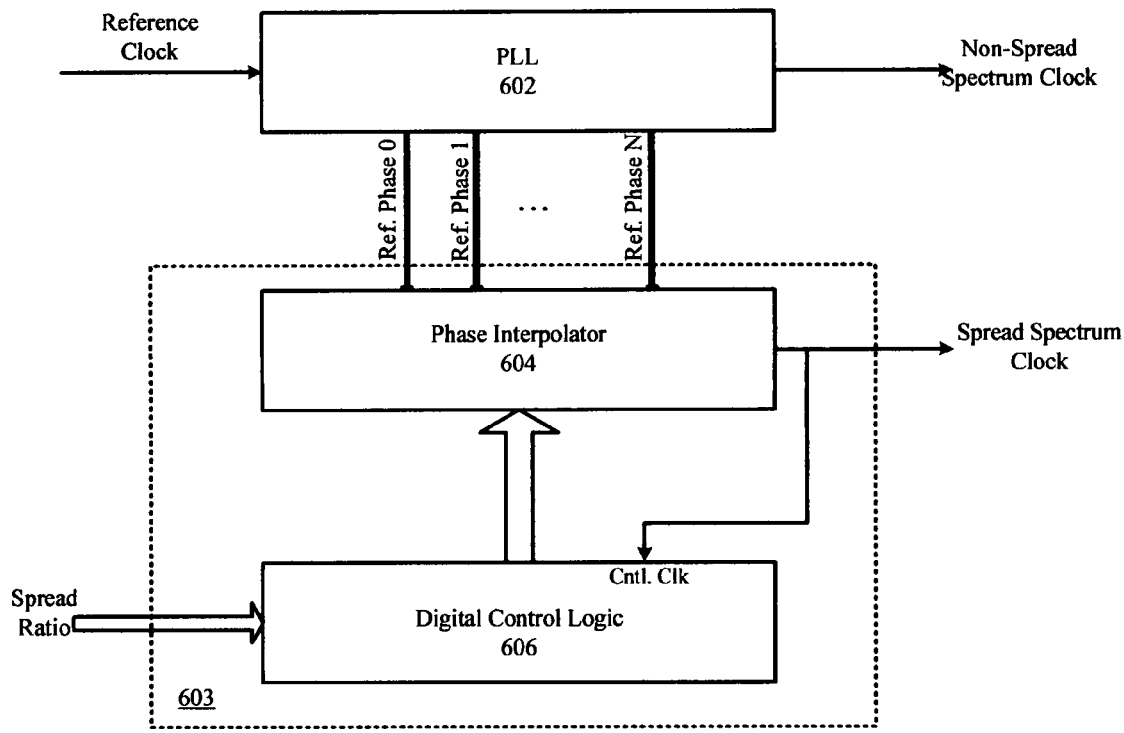
FIG. 6 is a diagram of another SSC generator circuit in accordance with some embodiments.

FIG. 6 shows an alternative embodiment for an SSC generator. In this embodiment, the reference phase generation circuit is implemented with a PLL, e.g., the reference phases are taken from tap-points between stages in a ring oscillator type voltage controlled oscillator (VCO) in the PLL. With this scheme, both a spread spectrum clock and non-spread spectrum clock are available from the same reference clock. In addition, the control clock is taken from the generated spread spectrum clock output, itself (rather, e.g., than from a constant frequency DLL or PLL clock).

It generally comprises a PLL 602, phase interpolator 604, and digital control logic 606, coupled together as shown. It operates essentially the same as with the generator described above, except its reference phases are tapped from a PLL, and its control clock is a variable frequency, spread spectrum clock. This results in not only its step jumps being different (increasing or decreasing depending on phase rotation direction), but also, it results in the step widths modulating. This can allow for even more flexibility in achievable SSC modulation profiles and provides for more synchronous control circuit operation relative to the generated SSC.

FIG. 7 shows exemplary analog phase interpolator 604 and digital control logic 606 blocks for the SSC generator of FIG. 6. The phase interpolator comprises first and second differential amplifiers formed from matched transistors N1 to N4, bias control and balancing transistors N5, N6 and P1-P4, and an output driver U1. The first amplifier (N1/N2) receives a first selected, differential reference phase reference signal (Vip_s[a]/Vin_s[a]) from the digital control logic, while the second amplifier (N3/N4) receives as its input a second selected phase reference signal (Vip_s[b]/Vin_s[b]) therefrom. For example, the first amplifier may receive the odd reference phase signals, while the second amplifier could receive the even reference phase signals. The amplifier legs are coupled together so that they effectively generate a weighted average of the applied first and second reference phase signals. The output of this result is provided at the output of buffer U1 as the SSC Out signal. The current sources for each amplifier are provided by the digital control logic (discussed below) and determine the weighting for the selected reference phase signals.

The digital control logic 606 generally comprises phase select logic 702, phase control logic 704, and bias control blocks 706, 708. They are coupled together as shown, with the bias generation circuits (706, 708) coupled, respectively, to the phase interpolator amplifiers N1/N2 and N3/N4 to provide them with controllable current sources to control their weighting functions.

The phase control logic 704 comprises multiplexers and counters to generate 6 bit, complementary bias control signals (BCt1[63:0], BCt1#[63:0]) to control the bias generators, as well as the phase select logic 702. In the depicted embodiment, each bias generator comprises 64 separate current sources, each of equal value. Within the phase control block 704, a so-called 64-bit "Johnson" counter is used to generate the BCt1 and BCt1# signals so that the current sources ramp upward or downward over 64 different levels between a min. and max. current value (the min. level corresponding to all 64 current sources being off and the max value corresponding to all 64 sources being on.)

The phase control logic also receives reference phase signals (Vip[3:0], Vin[3:0]) from the PLL 602. (In this embodiment, four differential reference phase signals are used. It comprises one or more multiplexers to select 2 of these reference phase clocks, as dictated by a phase enable (Phase En.[1:0]) signal from the phase select logic 702. In accordance with some embodiments, the phase select logic 702 is implemented with a finite state machine to cycle through the different adjacent reference phase selections. Control information is provided to the phase control logic 704 to in essence, set the Mod and Step values in order to control the amount of frequency spread and other parameters for the generated spread spectrum clock.

Figure 8:
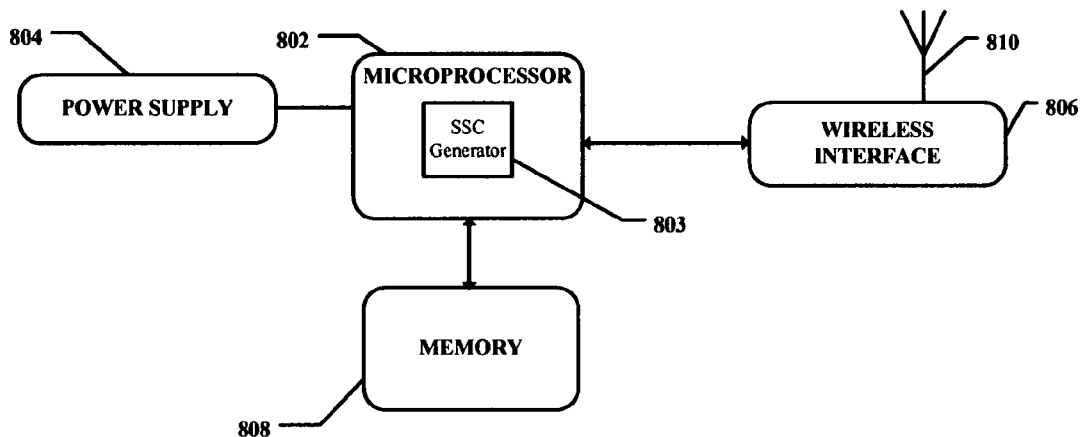
FIG. 8 is a diagram of a computer system having a microprocessor with at least one SSC generator circuit in accordance with some embodiments.

With reference to FIG. 8, one example of a computer system is shown. The depicted system generally comprises a processor 802 that is coupled to a power supply 804, a wireless interface 806, and memory 808. It is coupled to the power supply 804 to receive from it power when in operation. The wireless interface 806 is coupled to an antenna 810 to communicatively link the processor through the wireless interface chip 806 to a wireless network (not shown). Microprocessor 802 comprises one or more SSC generators 803 such as are disclosed herein.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   a first circuit to provide two or more different reference phase clocks derived from a reference clock having a reference clock frequency;
   a phase interpolator coupled to said first circuit to generate an output clock having a controllable phase based on selected first and second reference phase clocks from the two or more reference phase clocks; and
   control circuitry to rotate the controllable phase at a lower frequency than the reference clock frequency to cause the output clock to provide a spread spectrum clock with a desired profile.

2. The chip of claim 1, in which the output clock provides a spread spectrum clock with a desired modulation profile.

3. The chip of claim 2, in which the modulation profile is a triangle wave.

4. The chip of claim 3, in which the two or more reference phase clocks are distributed evenly about a phase plane.

5. The chip of claim 1, in which the phase interpolator has first and second current bias inputs for weighting the first and second selected reference phase clocks to generate the controllable phase.

6. The chip of claim 5, comprising a current mode digital to analog converter having complementary current outputs coupled to said first and second current bias inputs.

7. The chip of claim 6, in which the current mode digital to analog converter comprises first and second sets of N digitally engageable current sources of substantially equal levels.

8. The chip of claim 7, in which the first and second sets of n digitally controllable current sources are controlled by normal and complementary outputs from a Johnson type counter.

9. The chip of claim 1, in which the first circuit comprises a delay locked loop circuit.

10. The chip of claim 1, in which the first circuit comprises a phase locked loop.

11. The chip of claim 1, in which the control circuitry comprises a counter to select the first and second reference phase clocks and to control their relative contributions to the generation of the controllable phase.

12. The chip of claim 11, in which the counter is formed from a multi-bit latch and one or more multi-bit summing circuits.

* * * * *